United States Patent
Boys

(10) Patent No.: US 7,633,235 B2
(45) Date of Patent: Dec. 15, 2009

(54) INDUCTIVELY-POWERED POWER TRANSFER SYSTEM WITH ONE OR MORE INDEPENDENTLY CONTROLLABLE LOADS

(75) Inventor: John Talbot Boys, Auckland (NZ)

(73) Assignee: Auckland Uniservices Limited, Auckland (NZ)

( * ) Notice: Subject to any disclaimer, the term of this patent is extended or adjusted under 35 U.S.C. 154(b) by 527 days.

(21) Appl. No.: 10/574,162

(22) PCT Filed: Sep. 29, 2004

(86) PCT No.: PCT/NZ2004/000236

§ 371 (c)(1),
(2), (4) Date: Feb. 14, 2007

(87) PCT Pub. No.: WO2005/031944

PCT Pub. Date: Apr. 7, 2005

(65) Prior Publication Data

US 2008/0129215 A1 Jun. 5, 2008

(30) Foreign Application Priority Data

Sep. 29, 2003 (NZ) .................................... 528542

(51) Int. Cl.
H05B 41/36 (2006.01)

(52) U.S. Cl. .................. 315/209 R; 307/104; 315/177; 331/1 R

(58) Field of Classification Search ................ 315/177, 315/185 R, 186, 200 R, 201, 200 A, 209 R, 315/210, 212, 219, 246, 276, 283, 287, 289, 315/291; 313/1 R, 3, 5, 18, 23, 25, 34, 35, 313/DIG. 3; 307/104, 145, 147, 148

See application file for complete search history.

(56) References Cited

U.S. PATENT DOCUMENTS

| 4,953,123 | A | | 8/1990 | Takeuchi et al. |
| 5,293,308 | A | | 3/1994 | Boys et al. |
| 5,630,836 | A | * | 5/1997 | Prem et al. .................... 607/61 |
| 6,047,535 | A | | 4/2000 | Schroers et al. |
| 6,091,779 | A | | 7/2000 | Griessbach |
| 6,317,338 | B1 | | 11/2001 | Boys |
| 6,345,203 | B1 | | 2/2002 | Mueller et al. |

(Continued)

FOREIGN PATENT DOCUMENTS

EP 886232 A2 12/1998

(Continued)

Primary Examiner—Douglas W Owens
Assistant Examiner—Jianzi Chen
(74) Attorney, Agent, or Firm—Darby & Darby PC

(57) ABSTRACT

The present invention provides a system for controlling one or more operating unites in an inductive power transfer (IPT) system. Each operating unit includes a pick-up coil that takes power from a primary conductor or track over an air gap. The operating unit is controlled by frequency modulating the primary conductor power supply to send a control instruction which is decoded by the operating unit. The instruction is decoded by generating a signal using a local oscillator in the operating unit and using the signal to detect changes in the frequency of the current in the primary conductor. Such a system can be used, for example, to control inductively powered road-studs that include a light source for controlling traffic on a roadway. A narrow band modulated data transmission system and method for controlling an operating unit are also provided.

50 Claims, 1 Drawing Sheet

U.S. PATENT DOCUMENTS

| | | | |
|---|---|---|---|
| 6,400,974 B1 * | 6/2002 | Lesho | 600/347 |
| 6,459,218 B2 | 10/2002 | Boys et al. | |
| 6,477,425 B1 | 11/2002 | Nowick et al. | |
| 6,750,560 B1 | 6/2004 | Nishimoto et al. | |
| 7,553,280 B2 * | 6/2009 | Lesho | 600/365 |

FOREIGN PATENT DOCUMENTS

| | | |
|---|---|---|
| FR | 2756953 | 6/1998 |
| JP | 2000011105 | 1/2000 |
| JP | 2001053657 | 2/2001 |
| JP | 2001067449 | 3/2001 |
| JP | 2001231811 | 8/2001 |
| NZ | 329195 | 7/2000 |
| WO | WO-0207173 | 1/2002 |

* cited by examiner

INDUCTIVELY-POWERED POWER TRANSFER SYSTEM WITH ONE OR MORE INDEPENDENTLY CONTROLLABLE LOADS

CROSS REFERENCE TO PRIOR APPLICATION

This is a U.S. National Phase application under 35 U.S.C. §371 of International Patent Application No. PCT/NZ2004/000236, filed Sep. 29, 2004, which claims priority to New Zealand Patent Application Serial No. 528542, filed on Sep. 29, 2003. The International Application was published on Apr. 7, 2005 as WO 2005/031944 A1 under PCT Article 21(2).

FIELD OF THE INVENTION

This invention relates to apparatus and methods enabling the independent control of operational characteristics of one or more loads or operating units associated with an inductive power transfer (IPT) system.

BACKGROUND TO THE INVENTION

One application of an IPT system where individual control of the loads is desirable is inductively powered road-studs. These are now a recognized traffic control technique, and are described in U.S. Pat. No. 6,459,218. As described in U.S. Pat. No. 6,459,218, a very low frequency (VLF) current is passed through a conducting wire (which may be referred to as a primary conductor or track) buried under the roadway. Road-studs sensitive to the magnetic field created by that wire are placed on the surface of the roadway and take power from the buried conductor by mutually coupling some of the magnetic field through a pick-up coil in the road-stud. The pick-up coil may be tuned with a capacitor to augment the power transfer process. The power transferred may be controlled by any of a variety of methods and used to drive traffic control lights as required. For example, one control method is described in U.S. Pat. No. 5,293,308, the contents of which are incorporated herein by reference.

In a separate development, U.S. Pat. No. 6,317,338 describes an intermediate tuned circuit (which may be referred to as an active node) that may be placed between the buried wire and the pick-up coil. Although U.S. Pat. No. 6,317,338 refers to use of the intermediate circuit with electroluminescent displays, it has equal application with the apparatus of the present invention. The contents of U.S. Pat. No. 6,317,338 are incorporated herein by reference. The intermediate tuned circuit enhances the magnetic field so that more power may be transferred for a given current in the buried wire. In practice a buried wire requires a 15-20 A current at 38.4 kHz to drive typical road-studs whereas with active nodes the current may be reduced to typically 5 A. A current of 5 A allows the use of lower cost, thinner conductors, and generators can power longer lengths for a given voltage rating. These advantages are possible as the road-studs do not move so that the active nodes may be accurately located. Such an advantage is not possible with a moving IPT monorail system.

Road-studs powered in this way are environmentally inert and unaffected by roading or weather conditions. They are spark-free and safe, and the loss by removal of one stud or more has no effect on the performance of others in the string. They may be turned on or off by switching the current in the buried conductor on or off. In U.S. Pat. No. 6,459,218 reference is made to selectively addressing or controlling one or more lamp units in a series, to enable independent control of individual units. It is indicated that this may be achieved by varying the amplitude or frequency of the primary current. The present invention concerns specific apparatus and methods for achieving independent control of one or more lamp units or other loads in an IPT system.

SUMMARY OF THE INVENTION

It is an object of the present invention to provide an IPT system with independently controllable loads or operating units. One specific object is to provide an IPT road-stud system in which the operational characteristics of individual road-studs, or groups of studs, is independently controllable. Other objects of the invention include the provision of an IPT system or a narrow band modulated data transmission system which reduces or overcomes one or more of the abovementioned limitations, or which at least provides the public with a useful alternative.

Accordingly in one aspect the invention consists in a method of controlling an inductively-powered operating unit for use in association with an inductive power transfer (IPT) system, the method comprising frequency modulating the current in a primary conductor circuit of the IPT system and, in the operating unit:

(a) detecting the frequency of current in the primary conductor circuit;
(b) generating a local oscillator signal;
(c) using the local oscillator signal to detect a change in the frequency of the primary circuit current; and
(d) using the detected change to control the operating unit.

The detected frequency is preferably used to ascertain the frequency of the local oscillator signal.

In a preferred embodiment the step of generating the local oscillator signal includes generating a local oscillator signal of a known frequency with respect to the unmodulated frequency of the primary circuit current The step of detecting a change in the frequency of the primary circuit current may include the step of subtracting the local oscillator signal from the detected frequency to provide an information signal, and detecting a change in the frequency of the information signal. Alternatively the step of detecting a change in the frequency of the primary circuit current includes the step of using the local oscillator signal to alias down the detected frequency to provide an information signal, and detecting a change in the frequency of the information signal.

Aliasing or subtracting can be performed using a sample and hold circuit to sample the detected frequency signal to provide the information signal, and sampling can be effected at the frequency of the local oscillator signal.

Detecting the frequency of the information signal is preferably performed by counting the number of cycles or part cycles of an oscillating signal of constant frequency in each cycle or part cycle of the information signal. The constant frequency signal may conveniently be the detected frequency signal.

The method may also include calibration of the frequency of the local oscillator signal with the frequency of the current in the primary conductor. This may be effected by detecting the frequency of the information signal, analysing the frequency over a pre-determined time period to obtain a frequency reference, comparing the frequency reference with a datum, and increasing or decreasing the local oscillator frequency to effect calibration.

At least one pre-determined threshold may be established associated with the frequency of the information signal, and this may be compared with the information signal to provide a digital output signal for control of the operating unit.

The primary conductor current may be modulated to provide an instruction to the operating unit, the resultant frequency change(s) associated with the modulation can be detected at the operating unit to decode the instruction, and the operating unit can be controlled in accordance with the instruction.

In a second aspect the invention consists in a controlled inductively powered unit for use in association with an inductive power transfer (IPT) system having a primary conductor circuit with a modulated current, the operating unit including:
- (a) signal detection means for detecting the frequency of current in the primary conductor circuit;
- (b) local oscillator means for providing a local oscillator signal;
- (c) signal processing means adapted to use the local oscillator signal to detect a change in the frequency of the primary conductor current; and
- (d) control means to control the operating unit dependent on the detected change.

The signal processing means preferably ascertain the frequency of the local oscillator using the detected frequency provided by the signal detection means.

The local oscillator means may provide a local oscillator signal of a known frequency with respect to the unmodulated frequency of the primary circuit current.

The signal detection means preferably provides a detected frequency signal representative of the frequency of the primary conductor current and includes comparison means to compare the frequency of the local oscillator signal with the frequency of the detected frequency signal to ascertain the frequency of the local oscillator signal.

The signal detection means provides a detected frequency signal representative of the frequency of the primary conductor current and may include frequency subtraction means to subtract the local oscillator signal from the detected frequency signal and provide an information signal for detecting the change in frequency of the primary conductor current. Alternatively or in addition the signal detection means includes sampling means which samples the detected frequency signal and provides an information signal for detecting the change in frequency of the primary conductor current.

The frequency subtraction means or the sampling means may be effected by sampling the detected frequency signal at the frequency of the local oscillator.

In a preferred embodiment a counter is provided to detect the frequency of the information signal by counting the number of cycles or part cycles of an oscillating signal of constant frequency in each cycle or part cycle of the information signal.

The counter counts the number of cycles or part cycles of the primary conductor current circuit in each cycle or part cycle of the information signal.

A comparator can be provided having a pre-determined threshold at one input and a signal representative of the frequency of the information signal at another input to provide a digital output signal for control of the operating unit.

Calibration means are preferably provided to calibrate the local oscillator signal frequency with the frequency of the current in the primary conductor circuit.

In a third aspect the invention consists in an inductive power transfer (IPT) system including a primary conductor circuit and one or more controlled inductively powered units as set forth in the preceding paragraphs relating to the second aspect of the invention, the units being associated with the primary conductor circuit and adapted to receive power inductively from the primary conductor circuit, wherein the primary conductor circuit includes frequency modulation means to modulate the frequency of current in the primary conductor circuit.

In a fourth aspect the invention consists in a roadway lighting system comprising a plurality of separately controllable road-studs, each road-stud including a light emitting element and being powered inductively via a primary conductor circuit buried under or in a roadway, frequency modulation means adapted to modulate current in the primary conductor circuit, and wherein each controllable road-stud includes:
- (a) signal detection means for detecting the frequency of current in the primary conductor circuit;
- (b) local oscillator means for providing a local oscillator signal;
- (c) signal processing means adapted to use the local oscillator signal to detect a change in the frequency of the primary conductor current; and
- (d) control means to control the operating unit dependent on the detected change.

The roadway may be one or more of: an automobile roadway; an aircraft runway or taxiway; a sidewalk or footpath.

In a fifth aspect the invention consists in a narrow band modulated data transmission system for controlling one or more light emitting units, the system including transmission means to transmit a modulated signal, and the or each light emitting unit including reception means tuned to receive the modulated signal, detection means to detect the data present in the received signal, and wherein the total power to operate the light emitting unit is derived from the received signal.

In a sixth aspect the invention consists in a method of controlling one or more light emitting units comprising:
 transmitting a narrow band modulated signal;
 receiving the modulated signal at a light emitting unit;
 detecting the data present in the received signal;
 controlling the light emitting unit dependent on the detected data, and;
 using the received signal to provide the total power to operate the light emitting unit.

In a seventh aspect the invention consists in a method of controlling traffic on a road, the method including the steps of incorporating a road way lighting system comprising a plurality of separately controllable road-studs into or onto the road, each road-stud including a light emitting element and being powered inductively via a primary conductor circuit buried under or in a roadway, frequency modulation means adapted to modulate current in the primary conductor circuit, and wherein each controllable road-stud includes:
- (a) signal detection means for detecting the frequency of current in the primary conductor circuit;
- (b) local oscillator means for providing a local oscillator signal;
- (c) signal processing means adapted to use the local oscillator signal to detect a change in the frequency of the primary conductor current; and
- (d) control means to control the operating unit dependent on the detected change, and modulating the frequency of current in the primary conductor circuit to initiate a pattern of operation of each controllable road-stud such that the plurality of road-studs provide a message to users of the road.

The frequency may be modulated such that the message includes sequential flashing of the controllable road-studs to indicate a direction or to indicate a speed limit.

The step of sequential flashing may involve activating all the light emitting elements and sequentially deactivating a minority of the light emitting elements.

In an eighth aspect the invention consists in a controllable road-stud system including:

a power supply for generating a substantially sinewave current in a primary conductive path characterised in that the frequency of the current can be modulated, a plurality of active nodes tuned to the power supply frequency located at specific points along the primary conductive path, a road-stud tuned to the power supply frequency located in close proximity to each of the active nodes, each road-stud including:

a pick-up coil with a tuning capacitor, rectification means for producing a DC source of power, control means for controlling the power flow from the primary conductive path to the road-stud, a light source means in series with a controllable switch connected across the DC source of power and active to switch the light source means on or off, signal detection means for detecting the frequency of the current in the primary conductive path or the current in the pick-up coil, means for producing a local oscillator signal at a known frequency relative to the detected frequency, means for tracking the local oscillator signal frequency against variations in frequency or components means for producing a signal representative of the difference frequency between the detected frequency and the frequency of the local oscillator signal, counting means for counting the number of cycles of the detected frequency in one cycle of the difference signal, comparator means for determining whether the counted number of cycles is greater or less than a comparison fixed number to provide a decoded output, and processor means to control the light source means on the road-stud according to the decoded output.

In a ninth aspect the invention consists in a controllable road-stud for use in association with an inductive power transfer (IPT) system having a primary conductive path with a frequency modulated current, the road-stud including:

means for producing a local oscillator signal in the road-stud of known accuracy with respect to the unmodulated frequency of the current in the track, means for using the local oscillator signal to detect changes in the frequency of the current in the primary conductive path, means for converting the detected changes to digital form to produce binary output representative of the modulation of the frequency of the current in the primary conductive path, a processing device for interpreting the binary output and driving switch means for switching a light source powered by the road-stud on or off as appropriate.

Variations in the local oscillator frequency caused by component differences or changes in temperature or time may be compensated for even though these changes may be significantly larger than the controlled frequency changes in the track current.

The primary conductive path preferably includes one or more active nodes.

The controllable road-stud includes a pick-up coil, and variations in the tuning of the active node or the pick-up coil preferably have substantially no affect on the ability of the apparatus to produce and process the binary output.

In a preferred embodiment the modulation of the current in the primary conductive path is in a range of substantially 1-1.5% of the unmodulated frequency of the current in the primary conductive path.

The light source may be capable of displaying more than one colour or a plurality of light sources are provided, and the processor may selectively switch that colour or those colours on or off in a desired sequence or pattern.

The IPT system may include one or more uncontrolled road-studs, all the road-studs being powered from the same primary conductive path and all the road-studs functioning without affecting the each other.

Each controlled road-stud may operate one or more light sources of different colours in any desired sequence of patterns or colours.

Other aspects of the invention may become apparent from the following description, given by way of example.

The words "comprise" or "comprises" or "comprising" are used in this specification in a manner which is intended to be inclusive rather than restricting.

BRIEF DESCRIPTION OF THE DRAWING

One or more preferred embodiments of the invention will be described below by way of example with reference to FIG. 1.

DETAILED DESCRIPTION OF THE INVENTION

Figure 1:
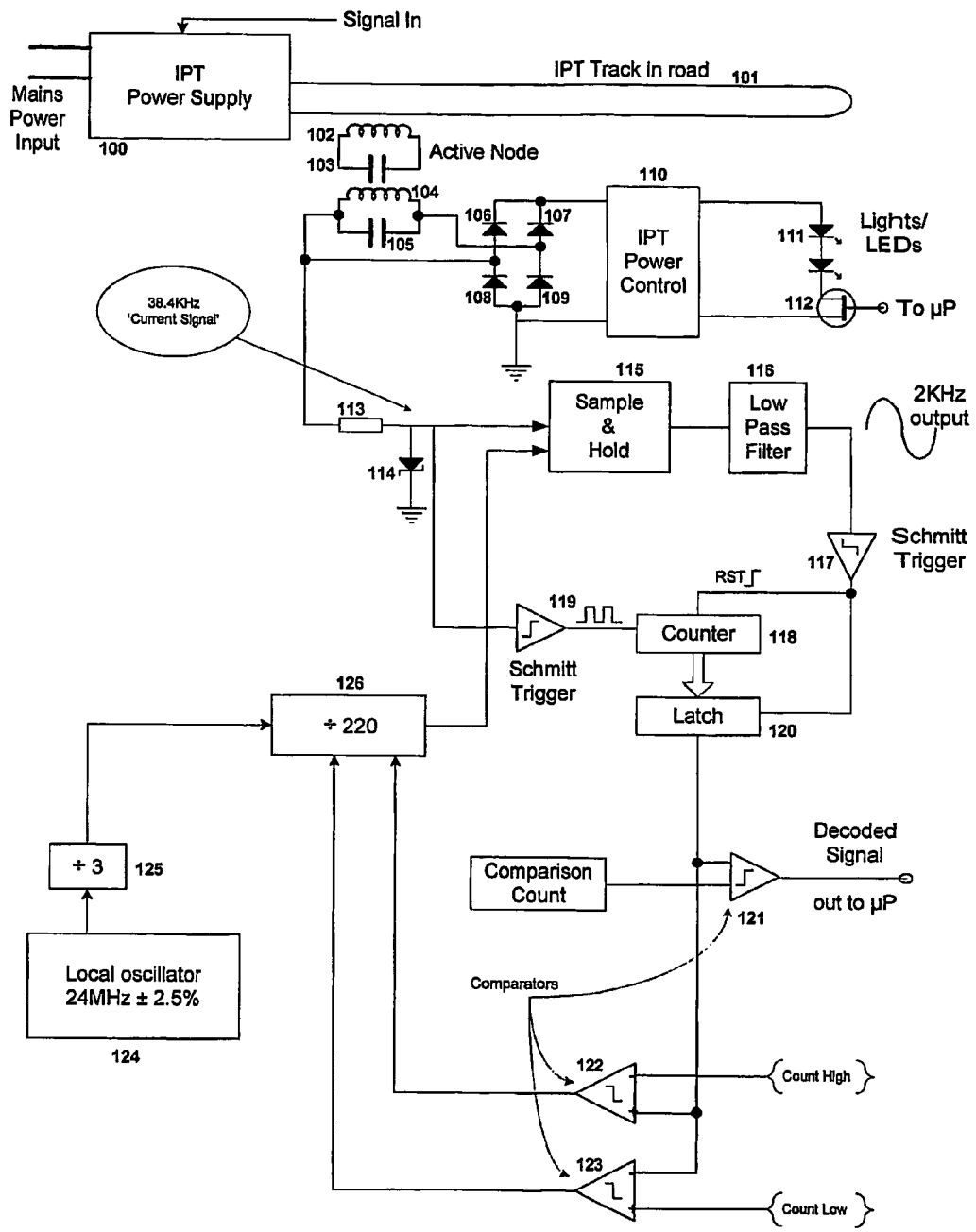
FIG. 1 illustrates a circuit diagram of an IPT system including a controlled road-stud.

The method and apparatus of the invention enables one or more of a series of loads associated with an IPT system to be independently controlled. Hereafter road-studs are used as a representative example of such "loads". However, it is to be appreciated that the invention is not limited to application with road-studs, and is similarly applicable to IPT systems involving lighting in tunnels, buildings, aircraft, etc (e.g. where strings of lights are used, such as emergency lighting, and there is a benefit through independent control of individual lights), sensors (where one or more of a series of sensors may need to be switched on or off or independently controlled), or any other series of loads which may be powered via an IPT system and where there is an advantage in the ability to control individual loads. It will be appreciated that such a system may include multiple road-studs, the figure just showing one illustrative example.

With regard to lighting strings, including road-studs, the invention will enable individual lights in the string to be turned on or off, they may be dimmed or brightened (for example by switching on and off using pulse width modulation), and they may change colour, as required, for specific control options. This improved functionality is achieved by overlaying control signals on top of the very low frequency (VLF) current in the buried conductor. The invention also overcomes problems associated with conventional systems where failure of one lamp leads to failure of the others in the string.

In a practical application for road-studs the buried conductor is specifically designed to operate at nominally 40 kHz, although 38.4 kHz is preferred. The roadway is a poor propagation medium for radio waves and the like so that it is not simple to get other frequencies to propagate along the buried conductor to the road-studs. In a preferred embodiment the actual power frequency of 38.4 kHz, is modulated to give a low bandwidth signal which is then detected in the road-stud. In principle a variety of modulation techniques are possible but the preferred method disclosed here is to frequency modulate the 38.4 kHz signal over a very small frequency range, up to approximately 1.5% for example. Simple amplitude modulation is also possible in principle but more difficult in practice as any studs switching on or off will cause transient disturbances in the current magnitude. With frequency modulation (FM) a frequency increase of say 1.5% corresponds to a 'one' while no change, or a decrease of 1.5%, corresponds to a zero. Using these simple '1' and '0' codes a message can be sent and received by all the road-studs but only activate the studs that it is intended for.

Conceptually an FM system is simple to implement but in practice there are a number of difficulties. First of all the actual signal comprising power and signal information has to be propagated down a long track with active nodes along its length and then has to be received in a pick-up coil which again is a tuned circuit. Clearly there should be no 'flicker' on the lights when information is being sent so the information must be contained in a relatively narrow bandwidth. Thus the signal to be 'detected' is narrow band FM. In practice in a road-stud the power frequency is 38.4 kHz and the modulation level suggested by way of example here is a frequency shift of 1.5% or 600 Hz. Larger shifts are not preferred as flicker becomes difficult to avoid, and smaller shifts take longer to detect, and are in fact more difficult to detect, so that the communications rate is necessarily smaller. Such deviations are easy to generate in the power supply where ample power and space are available but much more difficult to detect in the individual road-studs where space is at a premium, vibration is severe from passing vehicles, and roadway temperatures may vary from −20° to +80° C. at different times of the day or the season. A simple analog discriminator circuit is not sufficiently accurate to allow reliable operation under the expected road-stud conditions. Digital systems on the other hand present difficulties with resolution and absolute accuracy. A digital system may include a crystal reference but its performance in such a high vibration application would be suspect and crystals may add significant cost.

Traditional FM detection uses a discriminator or a phase locked loop, either using analog or digital technology. Highly stable oscillators using crystals as discussed above are not practical in the road-stud environment as the severe acoustic shocks caused by vehicles running over the studs cause the crystals to malfunction. Discriminators use high Q tuned circuits. Again it would be very difficult to make these functional in the road-stud environment where temperatures may vary from −20 to +80° C. The information being sent to the road-studs is in the form of instructions, for example turn on or off, brighter or darker, etc. To do this some intelligent processor is required so that some of the very limited space available in the road-stud must be taken up by a microprocessor and frequency detection techniques that are compatible with a microprocessor are to be preferred. The microprocessor cannot use a crystal reference so that accurate timing scenario possibilities are not in fact possible. Cypress Microsystems manufacture microprocessors that can operate under these conditions, for example their PSoC (Programmable System on Chip) can operate without a crystal reference with an oscillator frequency accurate within 2.5%. However, this error is already twice the modulation depth that is allowable to keep flicker small. Nonetheless these processors and others from other manufacturers do include a number of analog and digital blocks that can be programmed to be dedicated hardware and can thereby be used to fabricate a wide variety of analog and digital blocks controllable by the microprocessor.

In the physical space available in a road-stud and with practical power restraints (it is preferable to keep the total processor power demand less than approximately 0.1 W to ensure that the light source receives sufficient power), a digital phase locked loop is impractical. An analog phase locked loop is a possibility but it would need to be linked to a microprocessor to process the information recovered so again space demands would be a challenge. With a phase locked loop a local oscillator would be phase locked to the track current signal and as the frequency of the track current changes it follows the changes. Part of the phase locked loop is a voltage to frequency converter and the input voltage to this device is a direct analog measure of the local oscillator frequency and therefore of the track current frequency as one follows the other. With conventional components there would be substantial variation from one device to the next. In principle, if the frequency changes by 1.6% then the DC voltage driving the voltage to frequency converter will change by 1.6%. This value is larger than the resolution of an 8-bit A to D converter (0.4%) so it can in principle be detected by a simple low cost microprocessor. But with component variations there will be variations of +/−5% making the detection more difficult and the noise in the road-stud will also be significant.

The invention disclosed here is essentially a completely digital system where the only operations are simply counting. The invention allows one of these highly functional PSoC, or similar, microprocessors to be used thereby greatly reducing the amount of space actually required. Within the road-stud there are, as mentioned above, large magnetic fields at 38.4 kHz from the primary track and the resonant pick-up circuit and these introduce significant noise at the IPT track frequency into the microprocessor circuitry and this noise must be controlled to get reliable operation. In a preferred embodiment the invention allows all road-studs to be self-calibrating using only simple digital processes such as counting. There is one analog input where the track frequency signal is introduced and this signal preferably goes through a sample and hold circuit.

In the examples presented here two digital systems are used—one in the power supply and one in the road-studs. The power supply is particularly simple and produces a signal at 38.4 kHz with 1.5% variations. In perhaps the simplest method a high frequency crystal reference at precisely 7.68 MHz is divided by 200, using a simple digital divider, to produce a signal at 38.4 kHz. If the division ratio is changed to 197 the output frequency from the divider changes to 38.985 kHz—an increase of 1.52%. Similarly if the division ratio is changed to 203 the output frequency changes to 37.833 kHz—a reduction of 1.48%. These frequencies may be used to generate the currents in the primary conductor with great accuracy, virtually unaffected by temperature or ageing effects.

In the road-stud the situation is more difficult. At 38.4 kHz the period of a single cycle of the current in the buried conductor or track is 26.04 microseconds. With frequency modulation of 1.5% as outlined above the period will vary from 25.651 to 26.432 microseconds at the extremes of the frequency variation. Discriminating between these signals is extremely difficult. In the first place resolution to better than 100 nanoseconds is needed to produce for example 264 counts in a single cycle at the low frequency compared with 260 in the usual condition. Allowing for counting errors of +/−1 count the comparison is already difficult. In a noisy environment it is impossible. Again digital systems operating at higher frequencies will use more current, and power in the road-stud is a limited resource. Finally, there is the added complication that the frequency reference in the road-stud will not be precise and may have a permanent or temperature dependent offset of as much as +/−2.5%.

A new detection system is used here, and is described with reference to the following examples which are described in the context of a roadway lighting system with controlled road-studs enable a light source supplied by each stud to be selectively controlled. The invention is also applicable to the control of other IPT system applications including IPT systems that do not use active nodes and have operating units that supply loads other than light sources.

EXAMPLE ONE

In the road-stud the digital system operates at a nominal 38.4 kHz but generates a 'more or less' stable frequency say 6% lower than this nominal frequency, 36.096 kHz. The incoming frequency of 38.4 kHz from the primary conductor track circuit, with FM, is filtered to remove some noise and make it more stable. This signal is representative of the frequency of the current in the primary conductor and is then sampled with a sample and hold circuit at this 36.096 kHz frequency to produce a sampled sine wave output signal at 2.304 kHz, which can then be put through a low pass filter to remove unwanted noise. With the FM present, 38.985 kHz is converted to 2.889 kHz and 37.833 kHz is converted to 1.737 kHz. Thus the frequency of the current in the primary conductor has been effectively aliased down. These frequencies are easily and unambiguously detected counting at quite modest frequencies, for example 1 MHz. Measuring the periods to 1 microsecond gives an expected value (no modulation) of 434 microseconds with extreme values of 346 and 578 microseconds corresponding to data bits '1' and '0'.

In practice the actual road-stud reference frequency cannot be guaranteed within +/−2% so that all of these numbers may be higher or lower. In an additional advance in a preferred embodiment of the present invention codes are used where the numbers of '0' and '1' bits are always equal for every character. Thus, the number of nominal 346 counts and 578 counts must be equal so that when a continuous moving average is used the average count for '0', '1' sequences is essentially the same as the average unmodulated count; here the difference is 434 compared with 462. In these circumstances it is easy to determine the average count and then a simple table look-up will give the actual reference frequency in the road-stud and indicate what values should be used to determine a '0' or a '1'; here for example suitable values would be less than 400 counts for a '1' and greater than 500 for a '0'. These comparisons can then include significant hysteresis and can be expected to be robust.

When the offset frequency error in the road-stud controller is taken into account the observed numbers change. For example, with a road-stud reference 1% high at 38.784 kHz the new numbers, in comparison to the ideal numbers at 38.4 kHz are:

| Road-stud Frequency (Hz) | Sampling Frequency (Hz) | Track frequency range (Hz) | Sampled frequency (Hz) | Measured period (nominal μs) |
|---|---|---|---|---|
| 38,400 (Ideal) | 36,096 | High 38,985 | 2,889 | 346 |
| | | Average 38,400 | 2,304 | 434 |
| | | Low 37,833 | 1,737 | 578 |
| 38,748 (1% Offset) | 36,457 | High 38,985 | 2,528 | 400 |
| | | Average 38,400 | 1,943 | 520 |
| | | Low 37,833 | 1,376 | 739 |

Thus, given the average measured period, suitable numbers for '0' and '1' are easy to determine. However the average period 434 or 520 μs is also an important measure as essentially it indicates exactly what the operating frequency of the digital system in the road-stud is and with this number the actual road-stud frequency can be calibrated and referenced back to the frequency accuracy of the current in the buried conductor or track. This information allows accurate timing information to be available to the road-stud controllers so that operations can be precisely synchronised.

EXAMPLE TWO

As mentioned above, an accurate reference frequency is not available on the road-stud so narrow-band variations in the primary conductive track circuit frequency cannot be detected by simply measuring their period as there is insufficient resolution to get sensible results with limited accuracy frequency references. To improve the resolution the frequency changes can be increased in relative terms by mixing the observed track frequency down. For example if the track signal at a frequency of 38.4 kHz is multiplied by a signal of 36.4 kHz there will be two output frequencies at 2 kHz—the difference frequency, and 74.8 kHz—the sum frequency. When the track frequency changes by 1.5% (600 Hz), these frequencies change to 2.6 kHz and 75.4 kHz. If the high frequency 'sum' signal is eliminated the low frequency 'difference' signal now carries all of the information. As all of the interference in the road-stud is at 38.4 kHz the 2 kHz signal may be compared with it. This is a simple process, for one cycle of the 2.0 kHz signal count the number of track cycles. In this way simple calculations may be used to observe what is detected. Under nominally correct conditions the results are:

| Track Frequency (kHz) | Local Frequency (kHz) | Difference Frequency (kHz) | Output Counts |
|---|---|---|---|
| 38.4 | 36.4 | 2.0 | 19.2 |
| 39.0 | 36.4 | 2.6 | 15.0 |

While if the oscillator on the road-stud is 2½% low the measurements would be

| Track Frequency (kHz) | Local Frequency (kHz) | Difference Frequency (kHz) | Output Counts |
|---|---|---|---|
| 38.4 | 35.4 | 3.0 | 12.8 |
| 39.0 | 35.4 | 3.6 | 10.8 |

These track-cycle counts are synchronous at the noise or principal interference frequency so they are stable. Furthermore the output counts actually tell exactly what the local microprocessor frequency is. Thus if the nominal (low) count is 15 then the local frequency is 36.4 kHz, so they allow the on-board system to be exactly calibrated in terms of the local frequency. On the microprocessor this frequency is derived from a nominal 24 MHz source with a divider with a division ratio of 660 (approximately). So, in the second case, knowing that the count is 10.8 instead of 15 means that the nominal 24 MHz oscillator is actually at 23.364 MHz so if the division ratio was changed to 641 then the 2½% high system would be essentially identical to the nominally correct one. The number 660 is easily programmed as 3 times 220 and simply varying the 220 gives accuracy to better than 0.5% steps. So for example 641 would be programmed as 214×3=642 and the local oscillator frequency would be 36.392 kHz giving counts of 19.1 and 14.9 which are essentially the same as those for the nominally correct system. An exactly similar argument obtains when the nominal local frequency is high—up to a maximum value of 37.4 kHz for a 2½% error.

If the oscillator on the Road-stud is 2½% high the measured values would be:

| Track Frequency (kHz) | Local Frequency (kHz) | Difference Frequency (kHz) | Output Counts |
|---|---|---|---|
| 38.4 | 37.4 | 1.0 | 38.4 |
| 39.0 | 37.4 | 1.6 | 24.4 |

Thus in a practical system the microprocessor can monitor the numbers that it measures and keep slowly changing the division ratios to keep the numbers in the range 15 to 19. Whenever a number higher than 19 is measured the local frequency is reduced (the division ratio is increased) and whenever a number less than 15 is measured the local frequency is increased (the division ratio is reduced). Changes in the division ratio are in tiny steps, for example from 230 to 230.125 so that 8 consecutive measurements will be needed before the actual division becomes 231, and the actual overall variation cannot be greater that 2½% since this is the worst-case scenario for the local oscillator in a PSoC. In this way all of the road-studs on a track are essentially frequency locked to the actual track frequency and will maintain absolute accuracy from that point onwards. If the observed count is >17 then a '1' is being sent and if it is <17 then the system is in its unmodulated state.

The road-stud does not have to calibrate the frequency of the local oscillator to that of the track. For example, a look-up table may be used to allow the processor to look up the average count and obtain an appropriate range of counts representative of '1' and '0' outputs for that average. Thus it can use the look-up table for purposes of discrimination to produce the intended output.

Alternatively the local oscillator system in the microprocessor may be exactly calibrated with respect to the frequency of the current in the track by simply observing the numbers produced by the process outlined, and/or the range of counts produced:

| Local frequency (kHz) | Un-modulated output number | Range of Numbers |
|---|---|---|
| 36.4 | 19.2 | 4.2 |
| 35.4 | 12.8 | 2 |
| 37.4 | 38.4 | 14.4 |

For these examples, all local oscillator frequencies must be within this range 35.4-37.4 kHz (+/−2½%) and all possible frequencies correspond to a unique number of counts, so that there is no real need to change the division ratio at all since it is easy to see if the track frequency is modulated or not now that its known frequency has been exactly calibrated with respect to the track current frequency. But changing the division ratio makes all of the counts the same and makes the 'processing time' (the period of the 2 kHz waveform) essentially constant which are clear advantages. Also at 35.4 kHz the difference in counts is only 2 which in a digital system with typical +/−1 errors is a little small. This can of course be corrected by reducing all of the local oscillator frequencies, but then the processing time taken at 37.4 kHz will be longer still.

In a PSoC microprocessor there are no hardware multiplying functions for producing the sum and difference frequencies. But there is a sample and hold function and there are analogue filters. If the track frequency signal is sampled at a desired frequency such as the local oscillator frequency the difference frequency signal is produced with a very small sum frequency component. With nominal and non-critical filtering this difference signal can be smoothed and squared up using a Schmitt trigger to produce a square waveform at the nominal 2.0 kHz. All of these functions are available in the PSoC. Counting the number of track cycles in each period is easily done—again the PSoC has a function that can do this and the interpretation of the data into control signals can then be done in hardware or software in the PSoC as required.

Turning now to FIG. 1 a power supply 100 takes mains power from a utility supply and produces a current of typically 5 A at 38.4 kHz in IPT track 101, which in this example may be buried under a roadway. Those skilled in the art will appreciate that the circuit shown in FIG. 1 may, with suitable modifications, also form the basis for implementation of the system described with reference to Example 1 above. An active node comprising inductor 102 and capacitor 103 is tuned to the same frequency as the current in the track and produces an enhanced magnetic field in its immediate vicinity. Pick-up coil 104 is tuned with capacitor 105 at the track frequency and has a voltage induced in it from the magnetic field produced by inductor 104. The resonating voltage across the pick-up coil is rectified with a bridge rectifier comprising diodes 106,107,108, and 109. The power transferred to the pick-up coil is controlled by IPT power controller 110 and the DC output voltage from this controller is used to drive LED lights 111 switchable by MOS transistor 112.

The voltage across diode 108 varies at the track current frequency and is voltage limited by resistor 113 and diode 114 to give an essentially square waveform which is used as a current reference signal since it is at the same frequency as the track current i.e. it provides a signal representative of the frequency of the current in the primary track. This signal is input to sample and hold circuit 115. Local oscillator 124 is divided down by dividers 125 (divide by 3) and 126 (divide by nominal 220) to give a signal at 36.4 kHz which is used to clock sample and hold circuit 115. The output of sample and hold 115 is put through a low pass filter 116 to produce an information signal which in this example is a sinewave at 2 kHz. This sinewave is converted to a square wave by Schmitt Trigger 117 and this signal is used to reset counter 118 and transfer its contents to latch 120. The current reference signal on diode 114 is squared up by Schmitt trigger 119 and counted by counter 118. Thus the number in the latch is the number of track current cycles in the period of the 2 kHz signal from low pass filter 116, and is updated every cycle of the 2 kHz waveform. Comparator 121 compares the number in the latch 120 with a fixed number—typically 17 for example. If the latch value is higher the data is a 1, else it is a zero. Comparator 122 compares the latch number with a maximum value—19 for example. If it is higher then the division ratio in counter 126 is increased. Comparator 123 compares the number in latch 120 with a minimum value—15 for example. If it is lower then the division ratio for counter 126 is reduced.

The decoded signal from comparator 121 goes to a microprocessor (not shown) where its meaning is decoded from the sequence of ones and zeroes received and switch 112 can be operated to switch lights/LEDs 111 on or off as required.

Using a PSoC all of the components with reference numbers 115 and higher can be implemented in the microcontroller in hardware and software or some combination of the two. This is a huge saving in components and power and reduces both the physical component count and the space that these components occupy. The other components with reference numbers 114 and lower are power components and cannot be microminiaturised.

A major advantage of these signal processing techniques is that all the processing can be done in a single microprocessor or microcontroller with no external hardware. For example Cypress Systems Programmable System on a Chip (PsoC) can do all of these functions with a very small footprint, and at relatively low current.

Using this invention information can be sent from the power supply of an IPT system to one or more loads (e.g. a road-stud) associated with that system. The information can be coded and used to control one or more of the loads, e.g. to turn the load on or off or modulate its operation. For example the load may be one or more light sources of one or more different colours and brightness, colour change, on/off period may be controlled.

EXAMPLE THREE

In another innovation the circuit of FIG. 1 may be used without change to produce a self-calibrating system where exact tuning of the divider for the local oscillator 124 is obtained whether or not any data is actually being sent. Here power supply 100 switches the frequency of operation on a continuous basis by for example +/−0.8%. Thus the IPT track 101 has a frequency in it of typically 38.1 kHz or 38.7 kHz and switches between the two at a rate of perhaps 400 Hz for example. The circuit of FIG. 1 will now try to control the average frequency to be 38.4 kHz by adjusting the division ratio for divider 126. Here comparators 121, 122, and 123 can all use the same count as the comparison value. In fact two of these can be simply ignored and one comparator can be used set to the average expected count. If the count is high this is the decoded signal for a '1' and it is a signal to increase the division ratio; if it is low then the data is a zero, and a signal to reduce the division ratio. Essentially the unmodulated signal is now a continuously modulated signal. To send data over the link this regular switching pattern is disrupted. The frequency is usually switching high/low/high, so a double high for example is easy to detect as a start character followed by data bits and a parity bit if required, and a stop character which may be decoded by the microprocessor to provide an instruction for control of the light source (or other load). This technique will converge quickly. If desired the decoded output may be exclusive ORed with a sequence of ones and zeroes so that the sequential switching of the carrier gives a null output to the data decoding 121 but still adjusts the divider ratios. Advantageously the method is stable and high speed and uses balanced frequency deviations, for example +/−300 Hz, about a given central frequency which in this example is 38.4 kHz. It will converge to the correct frequency setting whether or not any data is actually being sent, even if the carrier frequency, in this example at 38.4 kHz, is actually present or is in fact completely suppressed as it is here.

The systems described above may be used to control automobile traffic, pedestrian traffic, or in other applications such as aircraft runway or taxiway traffic. A plurality of operating units may be provided, each being individually controllable so that the individual light sources may be controlled as a group (or in groups) from control apparatus associated with the primary power supply. The light sources may be controlled in one or more patterns of operation so that the plurality of light sources provides a message to the users of the relevant roadway, pathway or taxiway.

By way of example, the pattern of operation may include sequential flashing of the light sources to indicate a direction or a speed limit.

Controlled operating units according to the invention can be used alongside uncontrolled units powered from the same primary track, the different units functioning without affecting each other. Furthermore, the control of controlled operating units according to the invention is not affected by variations in coupling, such as variations in the tuning of the active node or the pick-up coil.

Those skilled in the art will realise that the invention provides a narrow band narrow band modulated data transmission system for controlling one or more operating units. The modulated signal provides information for controlling the unit and also provides the total power required to operate the unit. Although frequency modulation is used in the preferred embodiment, those skilled in the art will appreciate that other modulation schemes could be used, for example ASK, FSK, or PSK modulation. Also, the data transmission system may be used to control an operating unit alongside a separate IPT system which provides power to the unit as a whole, or powers part of the unit, for example the light source.

The scope of the invention is not limited to the specific embodiments described above but also includes those modifications, additions, improvements, equivalents and substitutions which a person skilled in the art would appreciate are within the scope of the invention.

What is claimed is:

1. A method of controlling an inductively-powered operating unit for use in association with an inductive power transfer (IPT) system, the method comprising the steps of:

frequency modulating a current in a primary conductor circuit of the IPT system; and, in the operating unit:

(a) detecting a frequency of current in the primary conductor circuit;

(b) generating a local oscillator signal;

(c) using the local oscillator signal to detect a change in the frequency of the primary circuit current; and (d) using the detected change to control the operating unit.

2. A method as claimed in claim 1 further comprising the step of using the detected frequency to ascertain a frequency of the local oscillator signal.

3. A method as claimed in claim 1 wherein the step of generating the local oscillator further comprises the step of:

generating a local oscillator of a known frequency with respect to an unmodulated frequency of the primary circuit current.

4. A method as claimed in claim 1 wherein the step of detecting a change in the frequency of the primary circuit current further comprises the steps of:

subtracting the local oscillator signal from the detected frequency to provide an information signal; and detecting a change in the frequency of the information signal.

5. A method as claimed in claim 4 wherein in the step of subtracting comprises the step of using a sample and hold circuit to sample the detected frequency signal to provide the information signal.

6. A method as claimed in claim 5 further comprising the step of sampling the detected frequency at the frequency of the local oscillator signal.

7. A method as claimed in claim 4 further comprising the step of detecting the frequency of the information signal by counting the number of cycles or part cycles of an oscillating signal of constant frequency in each cycle or part cycle of the information signal.

8. A method as claimed in claim 7 further comprising the step of counting the number of cycles or part cycles of the current in the primary conductor circuit in each cycle or part cycle of the information signal.

9. A method as claimed in claim 1 wherein the step of detecting a change in the frequency of the primary circuit current further comprises the steps of:
using the local oscillator signal to alias down the detected frequency to provide an information signal; and
detecting a change in the frequency of the information signal.

10. A method as claimed in claim 9, wherein the step of aliasing further comprising the step of using a sample and hold circuit to sample the detected frequency signal to provide the information signal.

11. A method as claimed in claim 1, further comprising the step of calibrating the frequency of the local oscillator signal with the frequency of the current in the primary conductor circuit.

12. A method as claimed in claim 11 wherein the step of calibrating further comprises the steps of:
detecting the frequency of the information signal;
analyzing the frequency over a pre-determined time period to obtain a frequency reference;
comparing the frequency reference with a datum; and
increasing or decreasing the local oscillator frequency to effect calibration.

13. A method as claimed in claim 1, further comprising the steps of:
establishing at least one pre-determined threshold associated with the frequency of the information signal; and
comparing the frequency of the information signal with the threshold to provide a digital output signal for control of the operating unit.

14. A method as claimed in claim 1, further comprising the steps of:
modulating the primary conductor current to provide an instruction to the operating unit;
detecting one or more frequency changes associated with the modulation at the operating unit to decode the instruction; and
controlling the operating unit in accordance with the instruction.

15. A controlled inductively powered unit for use in association with an inductive power transfer (IPT) system having a primary conductor circuit with a modulated current, the operating unit comprising:
a signal detection unit operable to detect a frequency of current in the primary conductor circuit;
a local oscillator unit operable to provide a local oscillator signal;
a signal processing unit operable to use the local oscillator signal to detect a change in the frequency of the primary conductor current; and
a control unit operable to control the operating unit dependent on the detected change.

16. A controlled inductively powered unit as claimed in claim 15 wherein the signal processing unit ascertains a frequency of the local oscillator using the detected frequency provided by the signal detection unit.

17. A controlled inductively powered unit as claimed in claim 15 wherein the local oscillator unit provides a local oscillator signal of a known frequency with respect to the unmodulated frequency of the primary circuit current.

18. A controlled inductively powered unit as claimed in claim 15 wherein the signal detection unit provides a detected frequency signal representative of the frequency of the primary conductor current and comprises a comparison unit to compare the frequency of the local oscillator signal with the frequency of the detected frequency signal to ascertain the frequency of the local oscillator signal.

19. A controlled inductively powered unit as claimed in claim 15 wherein the signal detection unit provides a detected frequency signal representative of the frequency of the primary conductor current and comprises a frequency subtraction unit operable to subtract the local oscillator signal from the detected frequency signal and provide an information signal for detecting the change in frequency of the primary conductor current.

20. A controlled inductively powered unit as claimed in claim 19 wherein the frequency subtraction unit samples the detected frequency signal at the frequency of the local oscillator.

21. A controlled inductively powered unit as claimed in claim 19 further comprising a counter to detect the frequency of the information signal by counting the number of cycles or part cycles of an oscillating signal of constant frequency in each cycle or part cycle of the information signal.

22. A controlled inductively powered unit as claimed in claim 21 wherein the counter counts the number of cycles or part cycles of the primary conductor current circuit in each cycle or part cycle of the information signal.

23. A controlled inductively powered unit as claimed in claim 19 further comprising a comparator having a pre-determined threshold at one input and a signal representative of the frequency of the information signal at another input to provide a digital output signal for control of the operating unit.

24. A controlled inductively powered unit as claimed in claim 15 wherein the signal detection unit provides a detected frequency signal representative of the frequency of the primary conductor current and comprises a sampling unit which samples the detected frequency signal and provides an information signal for detecting the change in frequency of the primary conductor current.

25. A controlled inductively powered unit as claimed in claim 24 wherein the sampling unit samples the detected frequency signal at the frequency of the local oscillator.

26. A controlled inductively powered unit as claimed in claim 15 further comprising a calibration unit operable to calibrate the local oscillator signal frequency with the frequency of the current in the primary conductor circuit.

27. An inductive power transfer (IPT) system including a primary conductor circuit and one or more controlled inductively powered units as claimed in claim 15 associated with the primary conductor circuit and adapted to receive power inductively from the primary conductor circuit, wherein the primary conductor circuit comprises a frequency modulation unit operable to modulate the frequency of current in the primary conductor circuit.

28. A roadway lighting system comprising a plurality of separately controllable road-studs, each road-stud comprising:
a light emitting element and being powered inductively via a primary conductor circuit buried under or in a roadway,
a frequency modulation unit adapted to modulate current in the primary conductor circuit, and
wherein each controllable road-stud comprises:
a signal detection unit operable to detect the frequency of current in the primary conductor circuit;

a local oscillator unit operable to provide a local oscillator signal;

a signal processing unit adapted to use the local oscillator signal to detect a change in the frequency of the primary conductor current; and a control unit operable to control the operating unit dependent on the detected change.

29. A roadway lighting system as claimed in claim 28 wherein the roadway is an automobile roadway.

30. A roadway lighting system as claimed in claim 28 wherein the roadway is an aircraft runway or taxiway.

31. A roadway lighting system as claimed in claim 28 wherein the roadway is a sidewalk or footpath.

32. A narrow band modulated data transmission system for controlling one or more light emitting units, the system comprising:

a transmission unit operable to transmit a modulated signal, and each of the one or more light emitting units comprising:

a reception unit tuned to receive the modulated signal, a detection unit operable to detect the data present in the received signal, and wherein the total power to operate the light emitting unit is derived from the received signal.

33. A narrow band modulated data transmission system as claimed in claim 32 wherein the transmitted signal is a frequency modulated signal.

34. A method of controlling one or more light emitting units comprising the steps of:

transmitting a narrow band modulated signal;

receiving the modulated signal at a light emitting unit;

detecting a data present in the received signal;

controlling the light emitting unit dependent on the detected data; and using the received signal to provide the total power to operate the light emitting unit.

35. A method as claimed in claim 34 further comprising the step of transmitting a narrow band frequency modulated signal.

36. A method of controlling traffic on a road, the method including the steps of:

incorporating a road way lighting system comprising a plurality of separately controllable road-studs into or onto the road, each road-stud comprising a light emitting element and being powered inductively via a primary conductor circuit buried under or in a roadway, a frequency modulation unit adapted to modulate current in the primary conductor circuit, and wherein each controllable road-stud comprises: a signal detection unit operable to detect a frequency of current in the primary conductor circuit; a local oscillator unit operable to provide providing a local oscillator signal; a signal processing unit adapted to use the local oscillator signal to detect a change in the frequency of the primary conductor current; and a control unit operable to control the operating unit dependent on the detected change, and modulating the frequency of current in the primary conductor circuit to initiate a pattern of operation of each controllable road-stud such that the plurality of road-studs provide a message to users of the road.

37. A method as claimed in claim 36 further comprising the step of modulating the frequency such that the message includes sequential flashing of the controllable road-studs to indicate a direction.

38. A method as claimed in claim 37 wherein the step of sequential flashing involves activating all the light emitting elements and sequentially deactivating a minority of the light emitting elements.

39. A method as claimed in claim 36 further comprising the step of modulating the frequency such that the message includes sequential flashing of the controllable road-studs to indicate a speed limit.

40. A method as claimed in claim 39, wherein the step of sequential flashing involves activating all the light elements and sequentially deactivating a minority of the light emitting elements.

41. A controllable road-stud system comprising:

a power supply for generating a substantially sinewave current in a primary conductive path wherein a frequency of the current can be modulated, a plurality of active nodes tuned to the power supply frequency located at specific points along the primary conductive path, a road-stud tuned to the power supply frequency located in close proximity to each of the active nodes, each road-stud including:

a pick-up coil with a tuning capacitor, a rectification unit operable to produce a DC source of power, a control unit operable to control a power flow from the primary conductive path to the road-stud, a light source in series with a controllable switch connected across the DC source of power and active to switch the light source on or off, a signal detection unit operable to detect a frequency of the current in the primary conductive path or the current in the pick-up coil, a unit operable to produce a local oscillator signal at a known frequency relative to the detected frequency, a tracking unit operable to track the local oscillator signal frequency against variations in frequency or components unit operable to produce a signal representative of the difference frequency between the detected frequency and the frequency of the local oscillator signal, a counting unit operable to count a number of cycles of the detected frequency in one cycle of the difference signal, a comparator unit operable to determine whether the counted number of cycles is greater or less than a comparison fixed number to provide a decoded output, and a processor unit operable to control the light source on the road-stud according to the decoded output.

42. A controllable road-stud for use in association with an inductive power transfer (IPT) system having a primary conductive path with a frequency modulated current, the road-stud comprising:

a signal producing device operable to produce a local oscillator signal in the road-stud of known accuracy with respect to an unmodulated frequency of the current in the track, a unit operable to use the local oscillator signal to detect changes in the frequency of the current in the primary conductive path, a conversion unit operable to convert the detected changes to digital form to produce binary output representative of the modulation of the frequency of the current in the primary conductive path, a processing device for interpreting the binary output and a driving switch for switching a light source powered by the road-stud on or off as appropriate.

43. A controllable road-stud as claimed in claim 42 wherein variations in the local oscillator frequency caused by component differences or changes in temperature or time are compensated for even though these changes may be significantly larger than the controlled frequency changes in the track current.

44. A controllable road-stud as claimed in claim 42 wherein the primary conductive path includes one or more active nodes.

45. A controllable road-stud as claimed in claim 44 further comprising:
- a pick-up coil, and
- wherein variations in the tuning of the active node or the pick-up coil have substantially no affect on the ability of the apparatus to produce and process the binary output.

46. A controllable road-stud as claimed in claim 42 wherein the modulation of the current in the primary conductive path is in a range of substantially 1-1.5% of the unmodulated frequency of the current in the primary conductive path.

47. A controllable road-stud as claimed in claim 42 wherein the light source is capable of displaying more than one colour or a plurality of light sources are provided, and the processor may selectively switch that colour or those colours on or off in a desired sequence or pattern.

48. A road-stud system including a controllable road-stud as claimed in claim 42, further comprising one or more uncontrolled road-studs, wherein all the road-studs being powered from the same primary conductive path and all the road-studs function without affecting each other.

49. A road-stud system as claimed in claim 48 wherein each controlled road-stud can operate one or more light sources of different colours in any desired sequence of patterns and colours.

50. A system for controlling one or more light emitting units, the system comprising:
- a narrow band modulated data transmission system for controlling one or more light emitting units, the data transmission system comprising:
  - a transmission unit operable to transmit a modulated signal, and each of the one or more light emitting units comprising:
    - a reception unit tuned to receive the modulated signal, and
    - a detection unit operable to detect the data present in the received signal, and
- an IPT system, the IPT system providing power to the light emitting unit.

* * * * *